United States Patent [19]
Rowe et al.

[11] Patent Number: 4,739,448
[45] Date of Patent: Apr. 19, 1988

[54] MICROWAVE MULTIPORT MULTILAYERED INTEGRATED CIRCUIT CHIP CARRIER

[75] Inventors: David A. Rowe, Redondo Beach; Binneg Y. Lao, Rancho Palos Verdes; Robert E. Dietterle, Fullerton, all of Calif.

[73] Assignee: Magnavox Government and Industrial Electronics Company, Fort Wayne, Ind.

[21] Appl. No.: 623,990

[22] Filed: Jun. 25, 1984

[51] Int. Cl.$^4$ ............................................. H05K 7/20
[52] U.S. Cl. .................................... 361/386; 361/414
[58] Field of Search ............... 361/403, 410, 412, 413, 361/414, 386, 388

[56] References Cited

U.S. PATENT DOCUMENTS

| | | | |
|---|---|---|---|
| 2,981,868 | 4/1961 | Severson | 361/414 |
| 3,533,023 | 10/1970 | Friend et al. | 361/414 |
| 3,560,893 | 2/1971 | Wen | 333/24.1 |
| 3,568,000 | 3/1971 | D'Aboville | 361/414 |
| 3,705,332 | 12/1972 | Parks | 361/414 |
| 3,740,678 | 6/1973 | Hill | 361/414 |
| 3,798,575 | 3/1974 | De Brecht et al. | 333/10 |
| 3,835,421 | 9/1974 | De Brecht et al. | 333/26 |
| 3,867,759 | 2/1975 | Siefker | 361/414 |
| 4,047,132 | 9/1977 | Krajewski | 361/414 |
| 4,225,900 | 9/1980 | Ciccio et al. | 361/414 |
| 4,322,778 | 3/1982 | Barbour et al. | 361/414 |
| 4,414,480 | 11/1983 | Zasio | 307/443 |
| 4,498,122 | 2/1985 | Rainal | 361/414 |

OTHER PUBLICATIONS

Ho et al, "Multiple LSI Silicon Chip Modules with Power Buses Composed of Laminated Silicon Sheets with Metallized Upper and Lower Surfaces", IBM Technical Disclosure Bulletin, vol. 22, No. 8, 1/80, pp. 3410-3411.

Primary Examiner—A. D. Pellinen
Assistant Examiner—Gregory P. Thompson
Attorney, Agent, or Firm—Thomas A. Briody; William J. Streeter; Richard T. Seeger

[57] ABSTRACT

A multilayered integrated circuit chip carrier has a top layer, a signal line layer, a ground layer, a power conductor layer, and a bottom layer with a separating layer between adjacent layers. Each layer has coplanar conductive and dielectric portions, the separating layers being primarily dielectric. The top layer supports an integrated circuit chip and signal launcher pads on the bottom layer couple signal and power lines of a printed circuit board to spaced points about the bottom layer periphery and substantially constant signal line impedance is achieved. The signal line layer is separated from the power conductor layer by a ground plane layer. Conductive via through pads are placed in the separating layers to form a plurality of separate conductive paths from each of the bottom and top layers to each of the signal line and power conductor layers. Via through pads are also placed in the separating layers to break up cavities and thus increase cavity resonance above signal frequencies and are placed in the signal line layer to provide signal line isolation. Thermal columns of via pads in the separating layers and conductive portions in the other layers under the chip provide chip cooling. Large grounded conductive areas in the top and bottom layers reduce unwanted signal coupling to the external environment. A capacitive coupling on the top layer between a power conductor and ground provides power line isolation.

22 Claims, 8 Drawing Sheets

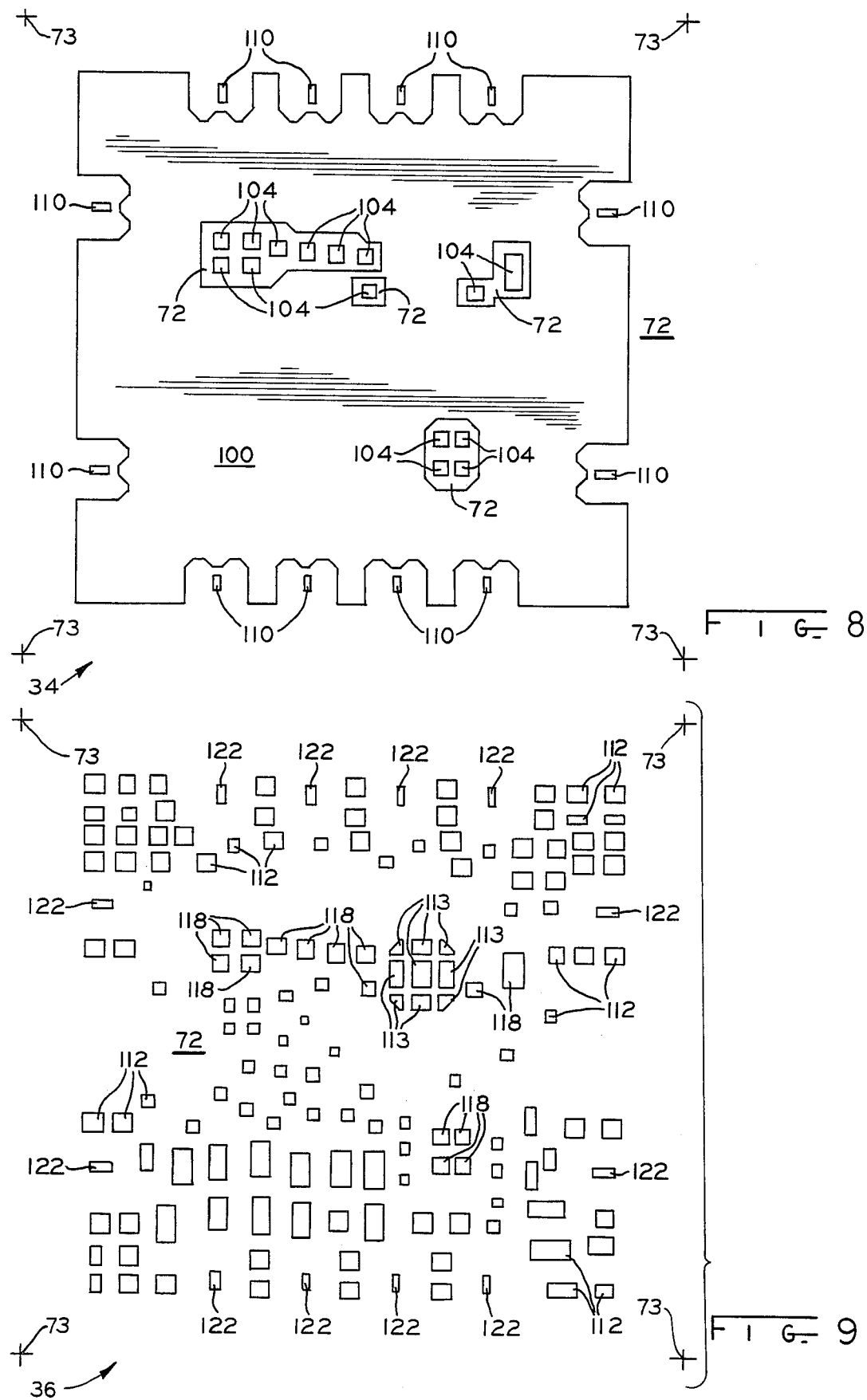

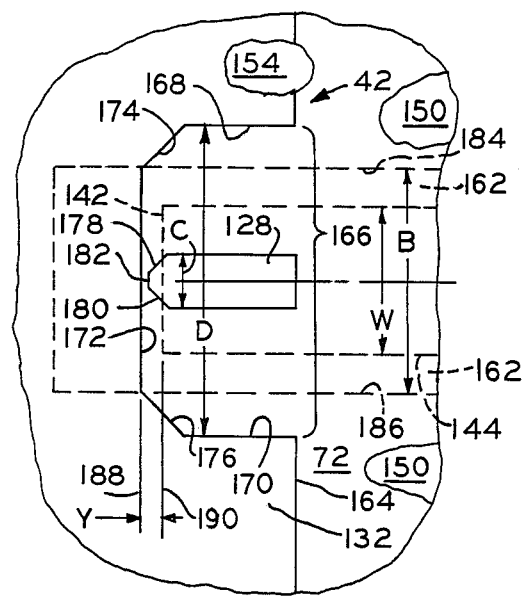
FIG. 15
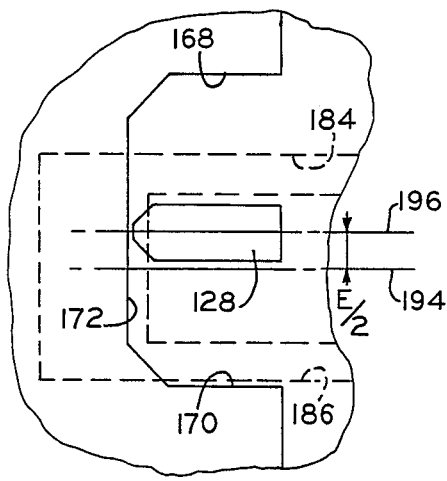
FIG. 16
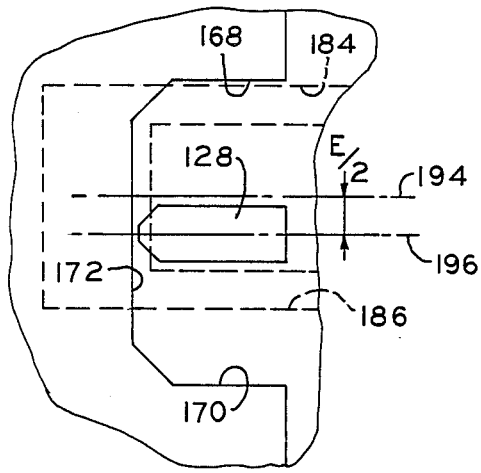
FIG. 17
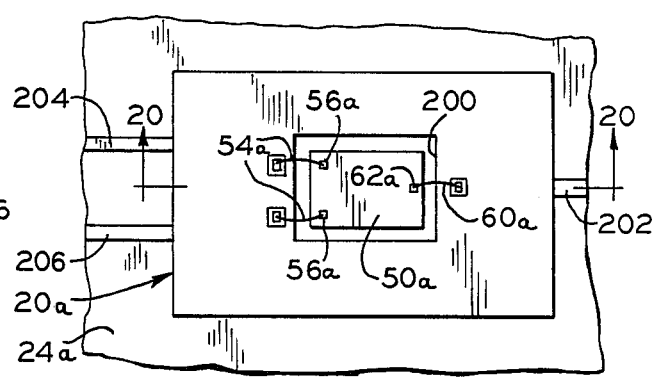
FIG. 19
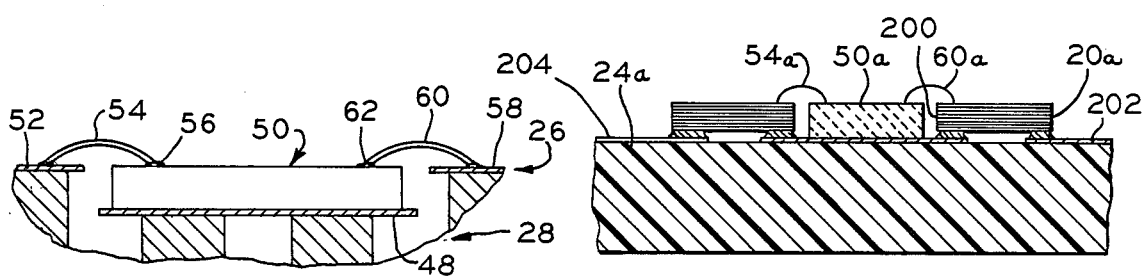
FIG. 18
FIG. 20

MICROWAVE MULTIPORT MULTILAYERED INTEGRATED CIRCUIT CHIP CARRIER

BACKGROUND OF THE INVENTION

1. Field of the Invention

This invention is in the field of RF (radio frequency) IC (integrated circuit) chip carriers for providing coupling between the terminal pads of a relatively small chip and the signal and power lines on a PC (printed circuit) board.

2. Description of the Prior Art

In low frequency IC chip carriers numerous problems exist due in part to the inherent difficulties of connecting the signal and power lines of a PC board to a relatively small IC chip having small closely spaced terminal pads. These problems include signal transmission lines having ill defined impedance and discontinuities causing multiple reflections that distort the waveform and degrade the noise margin, or signal to noise ratio. Cross talk between signal lines occurs degrading performance and causing false signals. The short rise time of digital signal waveforms results in noise spikes on adjacent signal lines. Also the characteristic impedance of the signal lines of the PC board is not properly matched to the impedance of the signal lines on the carrier, especially at the interface of the PC board and the carrier. Heat build up in the IC chip causes temperature related problems in chip performance. High impedance power lines are subject to spikes caused by large signal swings generated in the IC chip. Thus conventional carriers have disadvantages which have limited their operating properties and usefulness for high frequency (greater than 100 MHz) applications.

SUMMARY OF THE INVENTION

The IC chip carrier of this invention is a multilayered package having alternate "metal" layers and "dielectric" layers that is fabricated by an additive dielectric film process, such as a polyimide film process, in which metal layer geometry is obtained by etching with the etched portions being filled with a dielectric such as polyimide and each dielectric layer is plasma etched to provide a plurality of through holes which are filled, as by electroplating, with a metal, such as copper, to provide through via pads in the dielectric layer. Via pads are commonly referred to as "vias" in the art. The layers are designated from top to bottom as the top layer, on which the IC chip is mounted; a first separating layer; a signal line layer; a second separating layer; a ground plane layer; a third separating layer; a power conductor layer; a fourth separating layer; and a bottom layer to which all of the printed circuit board lines are connected. Each separating layer is a "dielectric" layer having numerous relatively small via through pads that provide electrical and/or thermal conductive paths between conductive portions of the "metal" layers on either side thereof. The signal and power flow takes place between the bottom layer and the top layer, and thermal energy flows from the top layer to the bottom layer through via pads in respective separating layers and conductive portions in respective "metal" layers.

The top, ground plane, and bottom layers have large conductive portions that are grounded as by a ground connection to the bottom layer through numerous via pads in the separating layers and conductive "islands" in the remaining metal layers. The signal line and the power conductors are electrically isolated and decoupled from one another by the ground plane layer and separating layers. The signal lines in the signal layer together with two grounded planes, one above and one below, form standard stripline transmission lines which maintain electrical impedance to designed values and the VSWR (voltage standing wave ratio) as low as 1.1. Also, all cavities between ground portions in the multilayer package are broken up and shorted to ground by grounded via pads so that cavity resonance frequencies are brought to well beyond the highest signal frequency. Grounded via pads in the signal line layer, which has a plurality of signal lines from the periphery of the signal line layer to an area directly beneath the IC chip location on the top layer, also serve to provide a shield between signal lines and prevent cross talk between signal lines.

A conductive metal lid in the form of a shallow inverted cup is conductively bonded, as by reflow soldering, to a grounded portion in the top layer and the lid covers the chip location area and substantially all of the top layer. The signal lines are in a separate layer and isolated from the cavity under the lid which helps to prevent oscillations in the signal line due to cavity resonance in the cavity under the lid.

The power line conductive areas in the top layer are capacitively bypassed close to the IC chip by forming a low inductive via pad path to the top layer and attaching a microwave chip capacitor between each power line conductive area and a grounded portion of the top layer. The separate power conductor layer has power conductors of a very low impedance. These features of the power supply interconnect of this invention provide greatly improved performance in suppressing spurious noise signals in the power conductor and resonance free operation to frequencies well above the highest signal frequency.

Signal interconnects or launchers are provided between the PC board lines and the signal and power conductive portions in the bottom layer. The launchers are dimensioned and spaced from grounded portions to lower the capacitance therebetween the thus control the impedance at the interface of the PC board and the bottom layer. Discontinuities are suppressed and a constant impedance is maintained in the signal path between the PC board lines and the IC chip.

Thermal columns comprised of conductive portions or "islands" in the "metal" layers and via pads in the separating layers, all directly below the IC chip location in the top layer provide for heat dissipation of the IC chip to the bottom layer where the heat is free to diffuse in the underlying substrate or heat sink thus cooling the IC chip. In the order of two watts per chip heat dissipation is possible with one embodiment of this invention.

It is therefore an object of this invention to provide an IC chip carrier package or interface for coupling an IC chip to a PC board having controlled impedance, suppressed cavity resonance in the signal frequency range, signal line isolation, improved power conductor performance, and improved thermal conductivity from the IC chip to a heat sink.

It is an object of this invention to provide a multilayered IC chip carrier package of the previous object having separate signal line and power conductor layers with at least one separating layer therebetween.

A further object of this invention is to provide in the carrier package of the previous objects a ground plane layer between the signal line layer and the power conductor layer with separating layers therebetween.

Another object of this invention is to provide in the carrier package of the previous objects via through pads in the layers to provide signal, power, and ground paths between the bottom and top layers and to break up cavities in the carrier package.

A still further object is to provide metallic thermal columns beneath the IC chip location on the top layer and through the intermediate layers to the bottom layer to greatly enhance the heat sinking capabilities of the package.

Another object is to provide signal launcher pads peripherally spaced in the bottom layer for connection to the PC board signal and power lines with controlled connection impedance.

The above mentioned and other features and objects of this invention and the manner of obtaining them will become more apparent and the invention itself will be best understood by reference to the following description of an embodiment of the invention taken in conjunction with the accompanying drawings.

BRIEF DESCRIPTION OF THE DRAWINGS

FIGS. 4–13 are enlarged top plan views of the individual layers in the carrier of FIG. 1;

FIG. 15 is an enlarged fragmented partially broken away schematic top plan view of a signal launcher pad used in the embodiment of FIG. 1;

FIGS. 16 and 17 are views similar to FIG. 15 showing the launcher pad is permissible error positions;

FIG. 18 is a fragmentary section similar to FIG. 3 of an alternate embodiment wherein the carrier is provided with a recess for chip mounting;

FIG. 19 is a simplified plan view of a "ring" carrier embodiment; and

FIG. 20 is a partially sectional view taken at 20—20 of FIG. 19.

DESCRIPTION OF THE PREFERRED EMBODIMENTS

Figure 1:
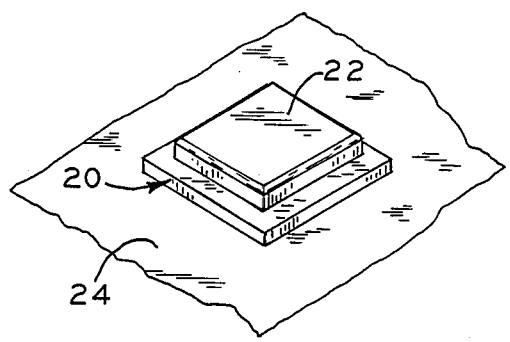
FIG. 1 is a fragmentary view in perspective of an IC chip carrier mounted on a PC board in an embodiment of this invention.
Figure 2:
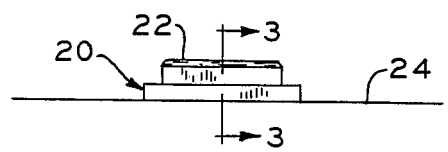
FIG. 2 is a side elevational view of the embodiment of FIG. 1.
Figure 3:
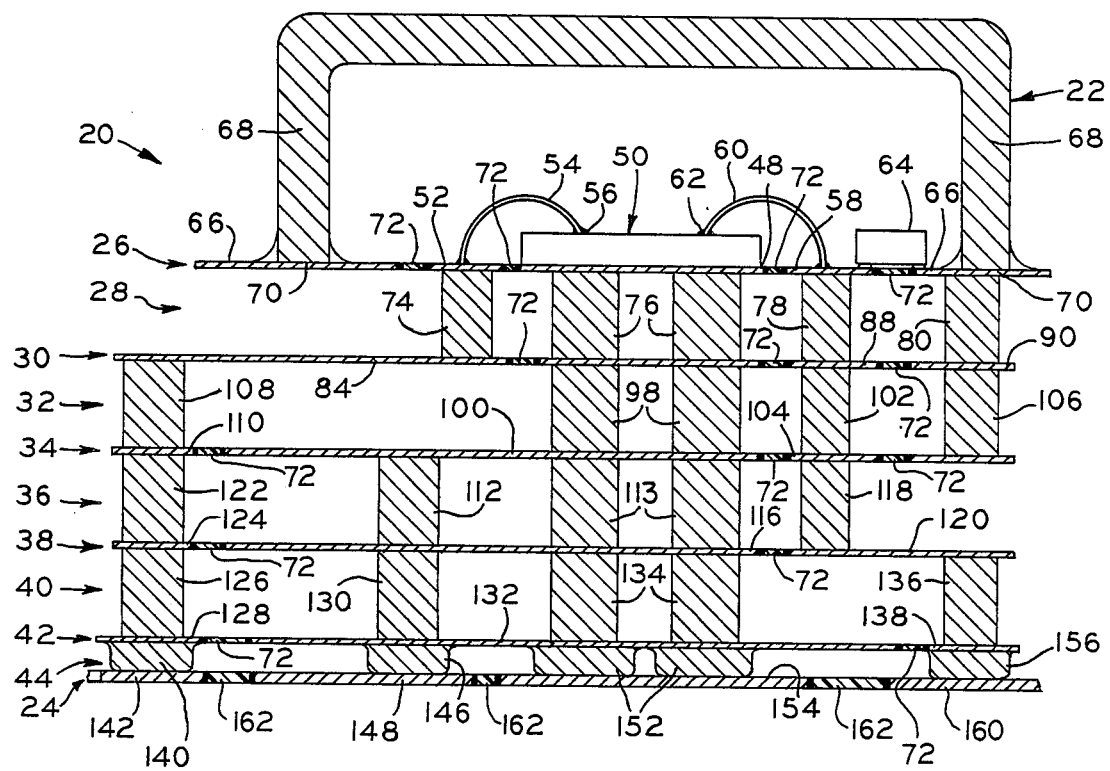
FIG. 3 is an enlarged partial composite section taken generally at 3—3 of FIG. 2 and is greatly simplified and is a composite of numerous vertical sections for explanatory purposes.

Referring to FIGS. 1–3, IC chip carrier 20 having lid 22 is mounted on PC board 24. The section shown in FIG. 3 does not depict the actual section taken at 3—3 in FIG. 2 but is much simplified for explanatory purposes. Thus, as will become apparent, an actual section would be more detailed and have components arranged differently and would not have all the components shown in FIG. 3. In this sense, FIG. 3 represents a composite of several sections and thus is an explanatory section.

Top layer 26 is a ground plane and chip mounting layer. First separating layer 28 is immediately below layer 26; signal line layer 30 is immediately below layer 28; second separating layer 32 is immediately below layer layer 30; internal ground plane layer 34 is immediately below layer 32; third separating layer 36 is immediately below layer 34; power conductor layer 38 is immediately below layer 36; fourth separating layer 40 is immediately below layer 38; bottom ground plane and PC board connection layer 42 is immediately below layer 40; and solder connection layer 44 is immediately below layer 42. Layers 26, 30, 34, 38, 42 are each "metal" layers having conductive portions, such as copper, and nonconductive or dielectric portions between the conductive portions. The dielectric portions may be formed by photoetching a metallic layer, such as copper, and the etched areas filled with a dielectric fill, such as polyimide, in conventional manner known to the art. Separating layers 28, 32, 36, 40, also "dielectric" or via pad layers, in this example are of polyimide material and have formed therein, as by plasma etching, a plurality of holes which are filled with conductive metallic material by electroplating to form the via through pads, later described. Thus, the via pads described herein are electrically and thermally conductive.

Figure 4:
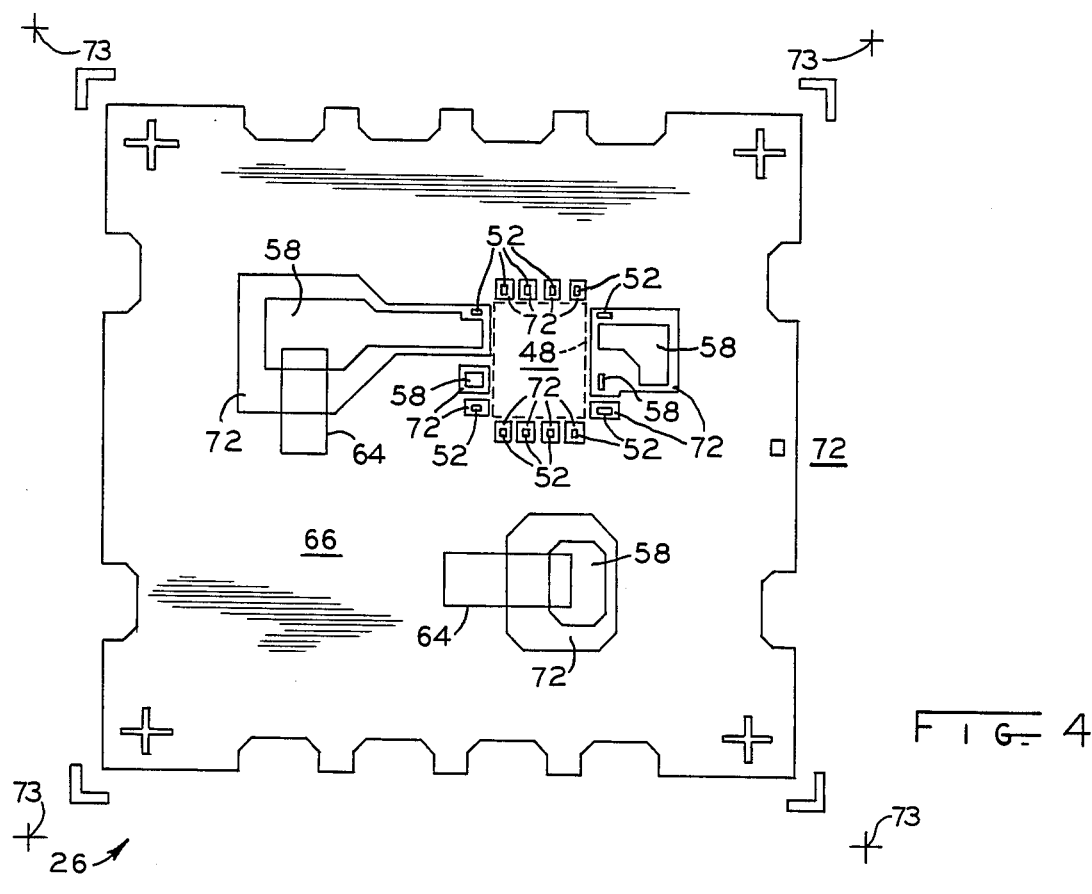

Referring to FIGS. 3 and 4, layer 26 is a ground plane and IC chip mounting layer having conductive portion 48, indicated within dashed lines in FIG. 4, at a chip mounting location. The lower surface of IC chip 50, which may be a gallium arsenide chip, is conductively bonded to portion 48. Each of a plurality of first conductive portions 52 in layer 26 is conductively connected as by wire 54 to a respective signal terminal pad 56 on chip 50. Each of a plurality of second conductive portions 58 on layer 26 is conductively connected as by wire 60 to a respective power terminal pad 62 on chip 50. Bypass capacitors 64 are conductively coupled between respective portions 58 and grounded portion 66 on layer 26 and provide together with the very low impedance of the power conductors, later described, an improvement in suppressing spurious signals in the power conductors by a factor of 20.

Metal lid 22 is in the form of a shallow inverted cup and has depending sides 68 having edges 70 conductively bonded as by reflow soldering to portion 66. In the drawings, all areas, unless otherwise designated, between conductive portions and/or via pads are understood to be of dielectric material. In FIGS. 3–13, all dielectric portions in all layers are designated by the reference numeral 72.

Figure 5:
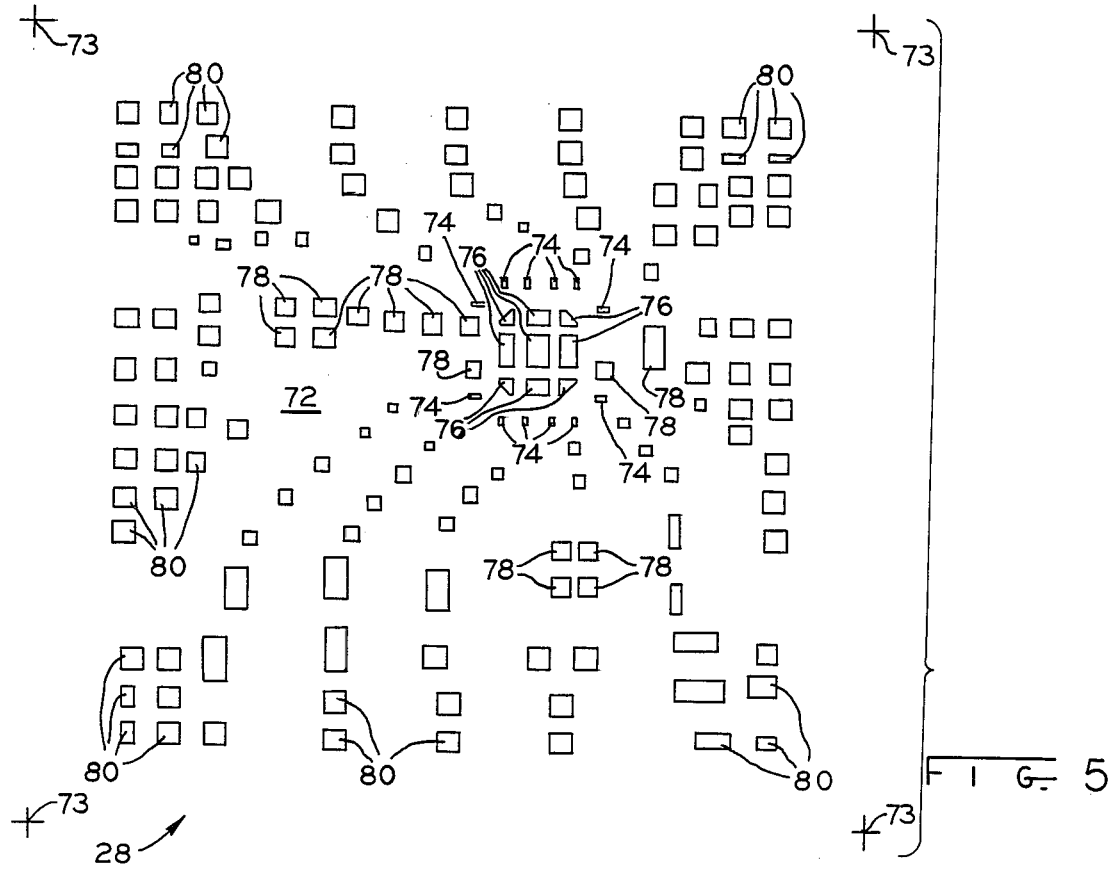
Figure 6:
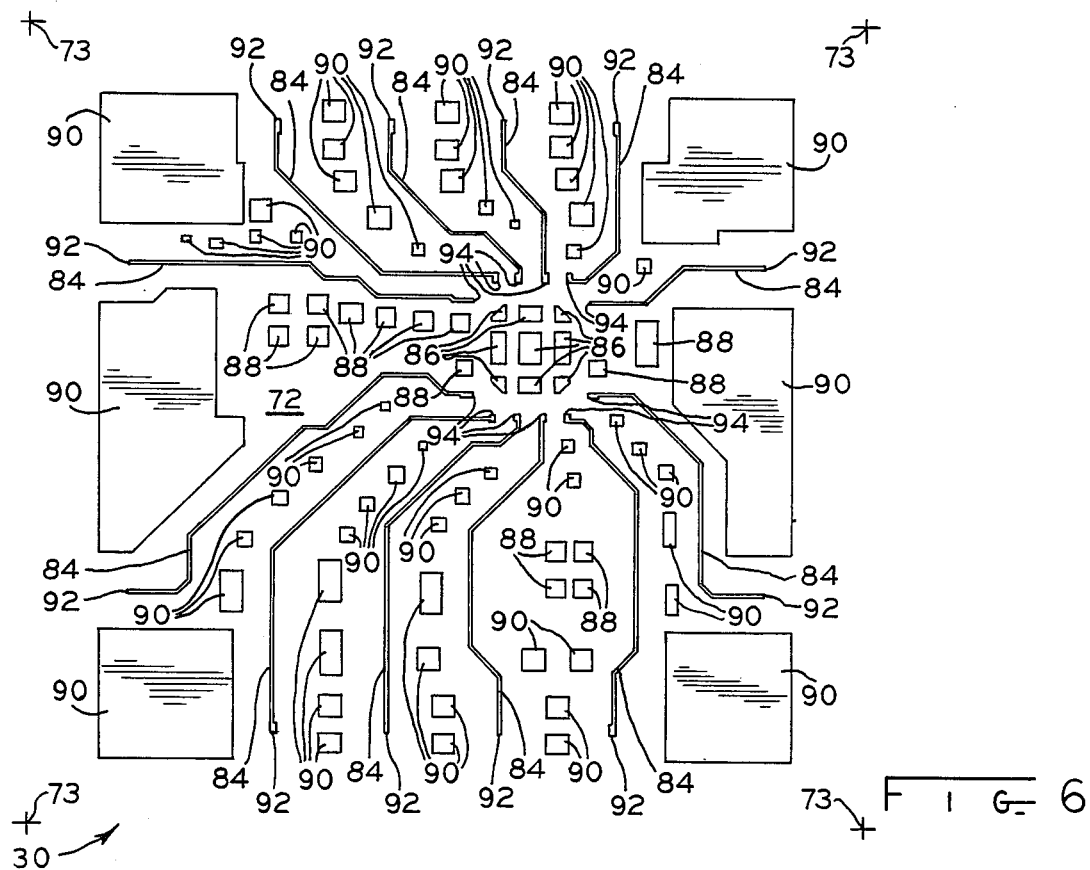

Referring to FIGS. 3–6, in layer 28 there are conductive via pads 74, 76, 78, 80, each pad in the explanatory section of FIG. 3 actually representing a plurality of pads as seen in FIG. 5. Also, it should be understood that when "conductive portion" or "via pad" is referred to herein in relation to a respective layer, that portion or pad is an "island" of conductive matter and is surrounded by dielectric and is insulated by dielectric from all other conductive portions and/or pads. Further, crosses 73 in all Figs. indicate registration marks and dielectric fill areas in layers 26–44 in which metal areas are formed as described for each layer. Also, due to numerous conductive pad sections in certain of the drawing Figs., which sections are cross sectioned for metal material, notes are used to indicate that if the sections do not have reference numerals they are assumed to have the reference numerals in the note. Each of via pads 74 in layer 28 conductively couples a respective conductive portion 52 in layer 26 to a respective signal line 84 in layer 30. Each of via pads 76 in layer 28 conductively couples conductive portion 48 in layer 26 to conductive pads 86 in layer 30. Each of via pads 78 in layer 28 conductively couples a respective conductive portion 58 in layer 26 to a respective conductive pad 88 in layer 30. Each of via pads 80 in layer 28 conductively couples ground conductive portion 66 in layer 26 to a respective ground conductive portion 90 in layer 30. Each of signal lines 84 in layer 30 has the same width which is substantially constant over its length and has a first end 92 at the periphery of layer 30 and a second end 94 adjacent the periphery of an area directly below locating portion 48 in layer 26. The signal lines are configured as a stripline and the the design methodology for determining each signal line 84 width can be found, for example, in "Computer-Aided-Design of Microwave Circuits" by K. C. Gupta et al., Artech House, Dedham, MA 02026 p. 100.

Line bends in lines 84 in this invention are limited to 45 degrees so that no line shape modification is needed to preserve the characteristic impedance of the line, in this example 50 ohms. Sharper line turns require 45° mitering in a manner understood in the art.

The signal line via pads 74 in layer 28 represent high impedance discontinuities but their effect is insignificant because of their short electrical length. In order to achieve high isolation between the lines 84 they should be separated from one another as much as possible. However their separation is limited by the radial distribution of the lines. Higher isolation is achieved in this invention by placement of grounded portions 90 in layer 30 between lines 84. If portions 90 are placed at a distance from any line 84 more than the separation of layers 26 and 34, in this example 11 mils, portions 90 will not affect the impedance of lines 84 significantly. Portions 90 vary in size according to the spacing between lines 84 and the spacing between portions 90 and lines 84 as described herein. All the small box like enclosures without reference numerals in FIG. 5 are via pads 80.

Figure 7:
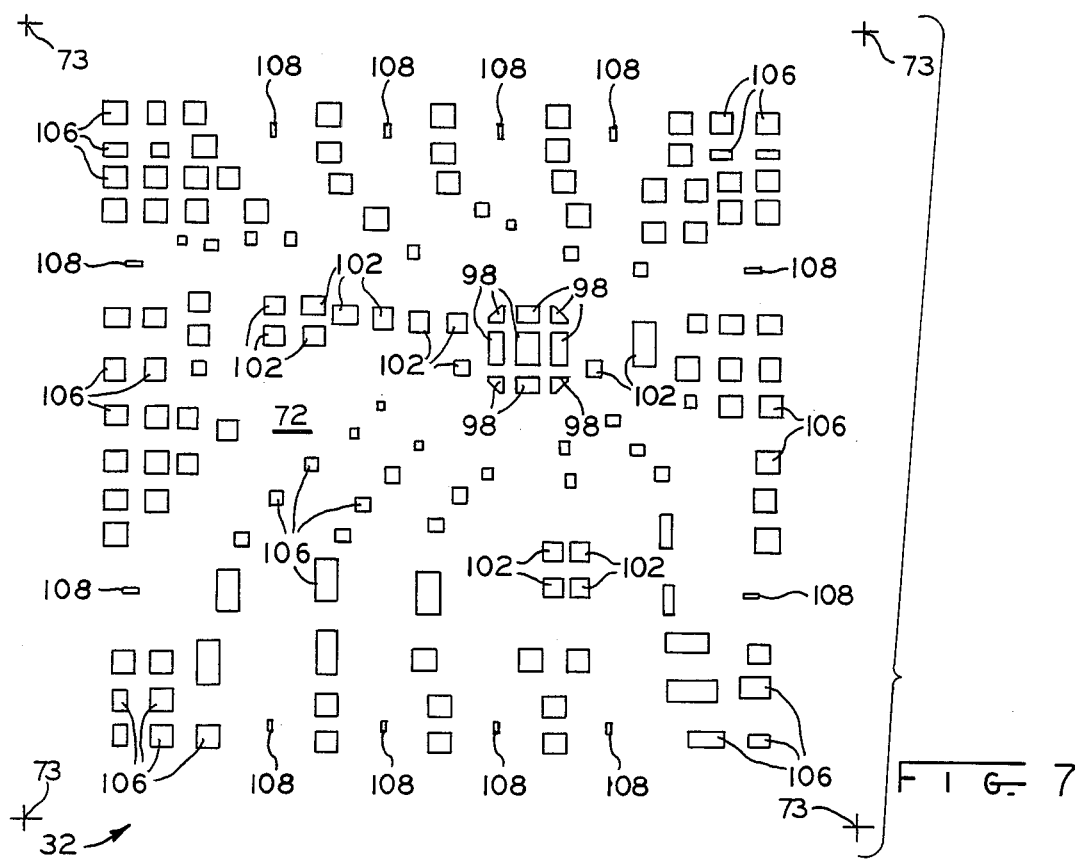
Figure 10:
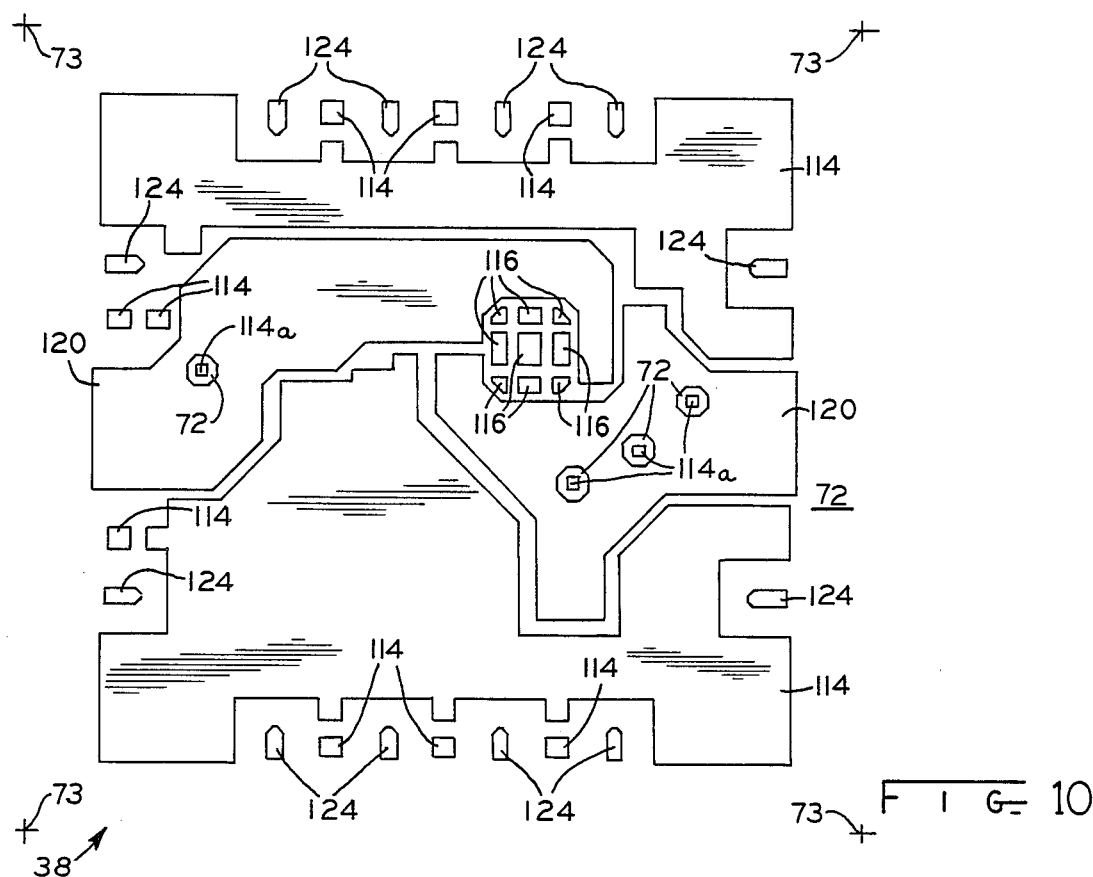

Referring to FIGS. 3 and 6-8, via pads 98 in layer 32 conductively couple respective pads 86 in layer 30 to ground conductive portion 100 in ground plane layer 34. Via pads 102 in layer 32 conductively couple respective power conductor pads 88 in layer 30 to respective power conductor pads 104 in layer 34. Via pads 106 in layer 32 conductively couple respective ground pads 90 in layer 30 to ground portion 100 in layer 34. Via pads 108 in layer 32 conductively couple ends 92 of signal lines 84 to respective signal pads 110 in layer 34. All the small box like enclosures without reference numerals in FIG. 7 are via pads 106.

Referring to FIGS. 3 and 8-10, via pads 112 in layer 36 conductively couple ground portion 100 in layer 34 to respective ground portions 114, 114a in layer 38. Portions 114a in power conductor portions 120 together with pads 112 in layer 36 and portions 130 in layer 40 are positioned to connect ground portion 100 in layer 34 to ground portion 132 in layer 42. They also serve to break the cavities in the region of portions 120 in layer 38. Via pads 113 in layer 36 conductively couple portion 100 in layer 34 to respective conductive pads 116 in layer 38. Via pads 118 in layer 36 conductively couple respective power pads 104 in layer 34 to respective power conductors 120 in layer 38. Signal via pads 122 in layer 36 conductively couple respective signal pads 110 in layer 34 to respective signal pads 124 in layer 38. This invention provides large area power conductors 120 that are spaced closely to ground portions 114 to increase the capacitance of conductors and lower conductor 120 impedance, in this example to less than 5 ohms, which also suppresses spurious noise spikes in the power conductor. All the small box like enclosures without reference numerals in FIG. 9 are via pads 112.

Figure 11:
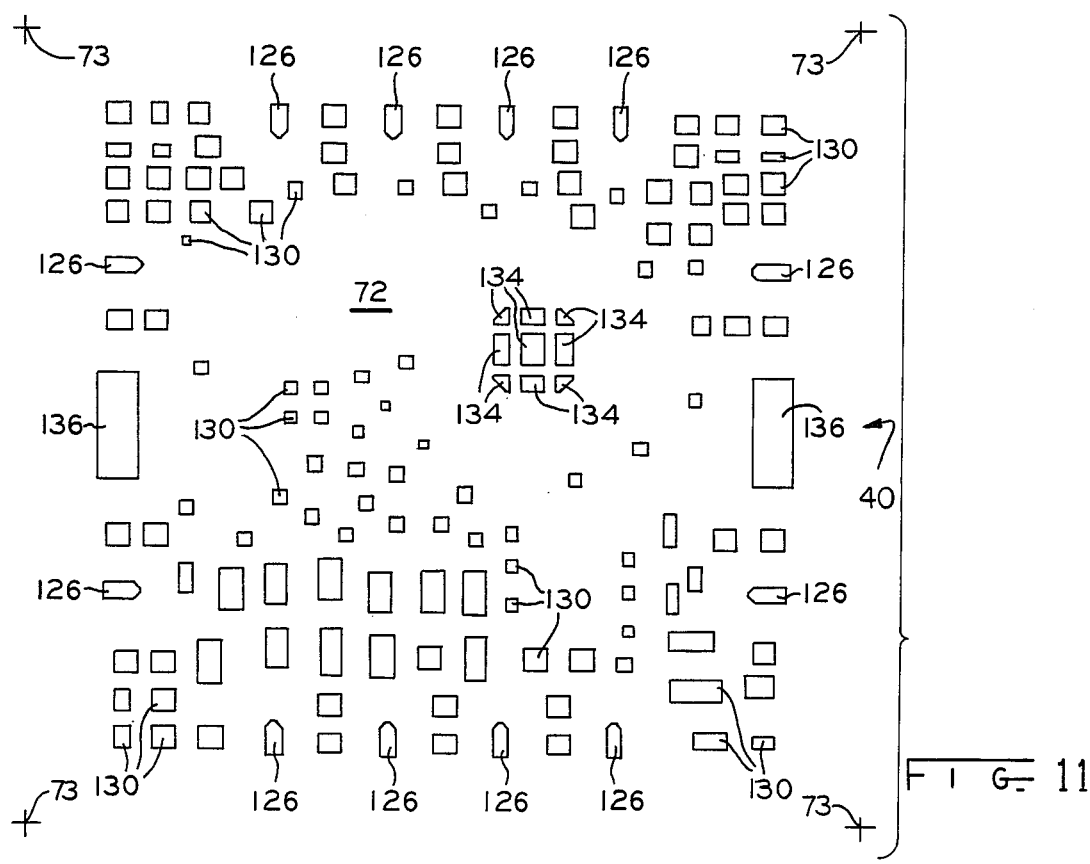
Figure 12:
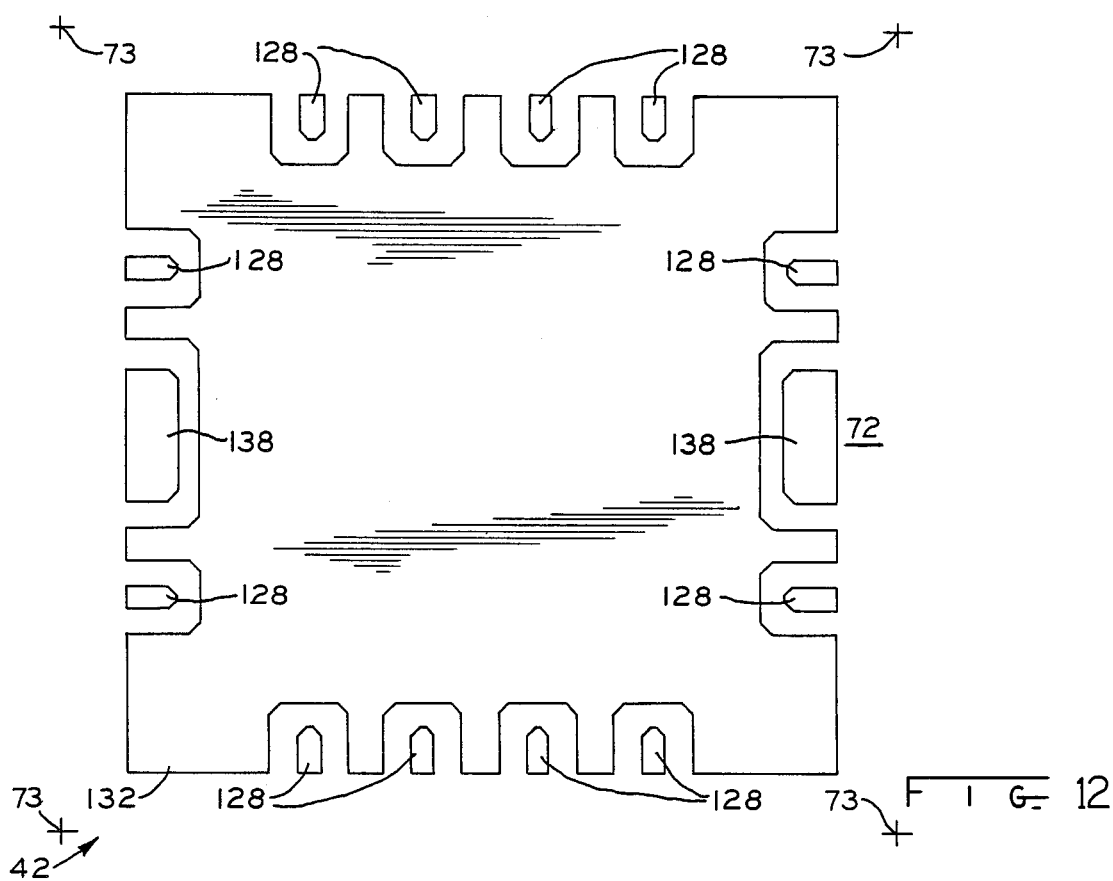
Figure 13:
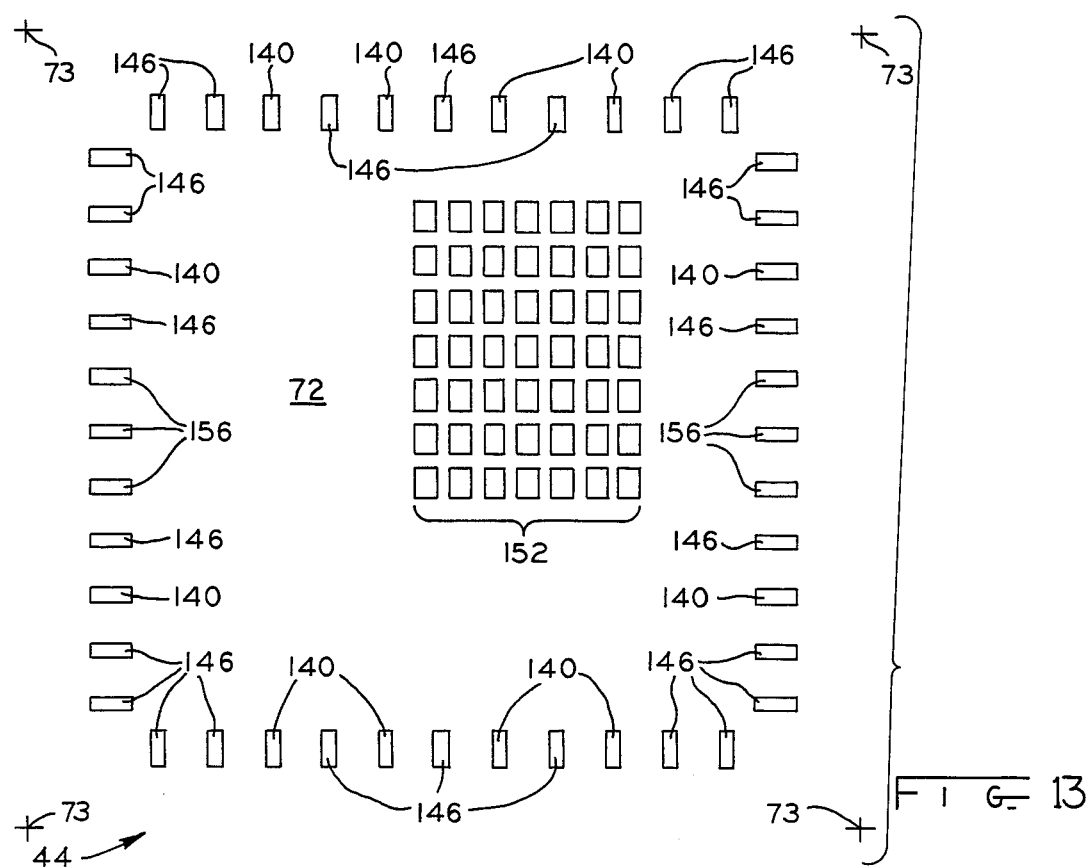

Referring to FIGS. 3 and 10-12, via pads 126 in layer 40 conductively couple signal pads 124 in layer 38 to signal pads 128 in layer 42. Via pads 130 in layer 40 conductively couple ground portions 114 in layer 38 to ground portion 132 in layer 42. Via pads 134 in layer 40 conductively couple thermal ground pads 116 in layer 38 to ground portion 132 in layer 42. Via pads 136 in layer 40 couple power conductor portions 120 in layer 38 to power pads 138 in layer 42. All the small box like enclosures without reference numerals in FIG. 11 are via pads 130.

Referring to FIGS. 3, 12-14, solder bumps 140 in layer 44 conductively bond signal pads 128 in layer 42 to ends 142 of coplanar signal lines 144 in PC board 24, there being a total of 12 signal lines in this example. The dielectric fill and pads 128, 138 in layer 42 have been omitted in FIG. 14 for explanatory purposes. Solder bumps 146 in layer 44 conductively bond ground portion 132 in layer 42 to ends 148 of ground lines 150 on PC board 24. Board 24 has coplanar ground portion 154 underlying and substantially coextensive with layer 42 and into which lines 150 feed. Solder bumps 152 conductively bond ground portion 132 in layer 42 to ground portion 154 in PC board 24. Solder bumps 156 conductively bond power pads 138 in layer 42 to ends 158 of power lines 160, of which there are two in this example, in PC board 24. All lines on board 24 are conductively insulated from one another by dielectric strips 162. Signal lines 144 and ground lines 150 and the dielectric spacing therebetween on board 24 are configured in a manner known to the art to maintain a constant characteristic impedance, e.g. 50 ohms using the design methodology in an article entitled "Numerical Analysis of Shielded Coplanar Waveguides" by D. A. Rowe and B. Y. Lao, inventors herein, and published in IEEE Transactions on Microwave Theory and Techniques, Volume MTT-31, November, 1983 issue, pp. 911-915, incorporated herein by reference.

An important feature of this invention is that via pads 80, 90, 106, 112, 130 in layers 28, 30, 32, 36, 40 respectively, are grounded and positioned to break up cavities between grounded surfaces in carrier 20 and short them to ground so that cavity resonant frequencies, 10 GHz in this example, are brought to well beyond the highest signal frequency, 5 GHz in this example. Thus, signal lines will not couple to these cavities and cause oscillations in the IC chip 50. These via pads also serve to provide shielding between the signal lines. These via pads are preferably placed at a distance from the signal lines greater than the separation of layers 26 and 34 which is in this example 11 mils so that the via pads will not affect the impedance of the line significantly.

Referring to FIG. 15, the geometry of a single signal pad 128 in layer 42 and its relation to ground portion 132 in layer 42 and to signal line 144 and ground line 150 in board 24 will be described, it being understood that all pads 128 in layer 42 have a similar geometry and relation to their corresponding signal lines 144 and all ground portions in all layers are recessed above respective signal pads in a similar fashion.

Ground portion 132 in layer 42 has straight sided edge 164. A notched recess 166 in ground portion 132 has opposite side edges 168, 170 and end edge 172 with tapers 174, 176 between end edges 172 and side edges 168, 170 respectively. Recess 166 is filled with dielectric portion 72. Pad 128 is oblong and centered over end 142 of signal line 144. One end of pad 128 has chamfers 178, 180 which meet at end 182.

Pad 128 is designed as a signal launcher for signal transmission from line 144 to via pad 126 so that the coplanar line 144 characteristic impedance and the stripline characteristic impedance in carrier 20 are substantially matched and constant. The width of pad 128 is designated as C; the width of notch 166, or the distance between edges 168, 170, is designated as D; the width of line 144 is W; the distance between edges 184, 186 of adjacent ground plane lines 150 is B; and the distance between end 142 and edge 172 is Y.

Once W is determined and the type of board 24 is decided upon, ground separation B can be calculated using the methodology in the aforementioned Rowe and Lao IEEE article. B, C, D and W obey the following relationships:

C<W

D>B

If E is the smaller of the two differences (W-C) and (D-B), then E/2 is the allowance for positioning carrier 20 on board 24. Dimension line 188 is at edge 172 and dimension line 190 is at end 142. Electrically the impedance to the right of line 190 is governed by PC board 24 impedance factors and the impedance to the left of line 188 governed by carrier 20 impedance factors. Gap Y between lines 188 and 190 represents a discontinuity but is insignificant. It is understood that a solder bump 140 is beneath each pad 128 and conductively bonds pad 128 to line 144.

In mating carrier pad 128 to line 144, some physical overlap of the two will unavoidably exist as shown in FIG. 15 where end 142 of line 144 extends under pad 128 when the two are mated. In the overlapped area the capacitance from either pad 128 and signal line 144 to ground will be more than either prior to mating. The added capacitance gives rise to a lower characteristic impedance than that of line 144 or pad 128. To compensate for this, coplanar ground portion 132 is moved away from signal line 144 by recess 166 so that the capacitance in that region is small in comparison with line 144 capacitance to ground lines 150. Thus, when mated the added capacitance is compensated for at the overlapped portion thus maintaining the characteristic impedance of line 144 through the mated overlapped portion. In one example of this invention, C=0.020"; D=0.100"; W=0.043"; B=0.060"; where dielectric constant of the board 24 is 4.7 and the board 24 thickness is 0.060".

This removal of ground portions adjacent every signal pad or line adhering to the above relationships is provided in bottom layer 42 and all other layers 26–40 to achieve substantially constant characteristic impedance at pads 128 when carrier 20 is mounted onto a PC board with the same impedance lines as lines 84 in carrier 20.

The impedance of carrier 20 transmission lines can be designed for other values. For example, gallium arsenide ICs with higher impedance input and output stages consume less power and therefore higher impedance lines in carrier 20 might be desired.

Carrier 20 is placed on top of board 24 ground 154 and solder bumps 152 provide heat conduction from chip 50 to extended ground 154 to enhance heat transfer. Ground portion 132 in layer 42 covers substantially all of layer 42, except for the signal and power line recesses, and also enhances heat transfer.

The minimum via pad surface dimensions are subject to fabricating techniques used and in this example the minimum via pad dimension is 7 mils. Each via pad area is determined by its functional requirements, subject of course to the aforementioned minimum dimension. The via pads that are used in break up cavities and are positioned between ground surfaces in carrier 20 and between signal lines for line isolation are spaced from one another such that the largest distance between via pads that are between signal lines does not exceed a quarter wavelength of the highest frequency at which the circuit operates. This largest distance dimension does not apply between pads on either side of, or across, a signal line but only to pads between signal lines. As mentioned, the via pads are positioned from the signal line a distance more than the separation between layer 26 and layer 34, which in this example is 11 mils. Corresponding via pads in other layers are likewise used to break up cavities between ground portions.

Via pads for connecting line ends 92 in layer 30, e.g. pads 108 in layer 32, pads 110 in layer 34, pads 122 in layer 36, pads 124 in layer 38, pads 126 in layer 40 to pads 128 in bottom layer 42 increase in size gradually from layer 32 to layer 40 due to the dimensional difference that exists between line 84 width and pad 128 width. The rate of increase is gradual and may vary.

Lid 22 is completely grounded on all sides and stripline geometry is used in carrier 20 for signal lines and no signal lines are exposed to the cavity under lid 22 except in layer 26 conductive areas 52 above via pads 74. Therefore very high isolation between chip 50 inputs and outputs and very little signal coupling to lid 22 cavity is obtained.

Referring now to FIGS. 16 and 17, two extremes of tolerable vertical positioning error are shown. In FIGS. 16 and 17, centerline 194 bisects the distance between sides 168, 170 of recess 166. Line 196 is the centerline of pad 128. The allowable distance between lines 194 and 196 is E/2 but ground line edge 186 on board 24, FIG. 16, should not overlap or be below side edge 170 nor should edge 184, FIG. 17, overlap and be above side edge 168.

Referring now to FIG. 18, a variation is shown wherein chip 50 is recessed into layer 28 with locating portion 48 being recessed into dielectric layer 28 and the top surface of chip 50 being coplanar with layer 26. In this embodiment the lengths of wires 54, 60 are shortened thus minimizing discontinuities caused by the wires. All other components being the same as for the embodiment of FIG. 3.

Referring to FIGS. 19, 20, a "ring" carrier 20a is shown, the layers in carrier 20a being the same as those described for carrier 20 and carrier 20a is not sectioned in FIG. 20. An oblong opening 200 is formed in carrier 20a into which chip 50a is inserted. Substrate 24a has lines 202, 204, 206 coupled to the bottom layer of carrier 20a as described for layer 42 to board 24, and wires 54a, 60a are conductively bonded to terminal pads on chip 50a and to pads on the top layer of carrier 20a as described for corresponding parts in the embodiment of FIG. 3. In this embodiment IC chip 50a is attached to substrate 24a which could be a larger carrier or a mother board and carrier 20a serves as a dimensional transformer between chip 50a and substrate 24a. The width dimensions of each of wires 202, 204, 206 may be in the order of tens of mils while each of chip 50 pads 56, 60 dimensions may be in the order of a few mils.

Layer arrangement may be varied and may include interchanging signal layer 30 with power conductor layer 38 in carrier 20 and ground layer 34 may be deleted while still retaining some advantages of this invention.

Layer thicknesses are determined by the aforementioned Gupta reference and in one example layers 28, 32 are each 5 mils thick; layers 36, 40 are each 2.5 mils thick; and "metallic" layers 26, 30, 34, 38, 42 are each one mil thick.

Carrier 20 may be designed and built using the principles of this invention to carry multiple IC chips 50. The materials used for carrier 20 may be other than polyimide and copper. Other dielectric and metal combinations such as ceramics and refractory metals can be used effectively.

Figure 14:
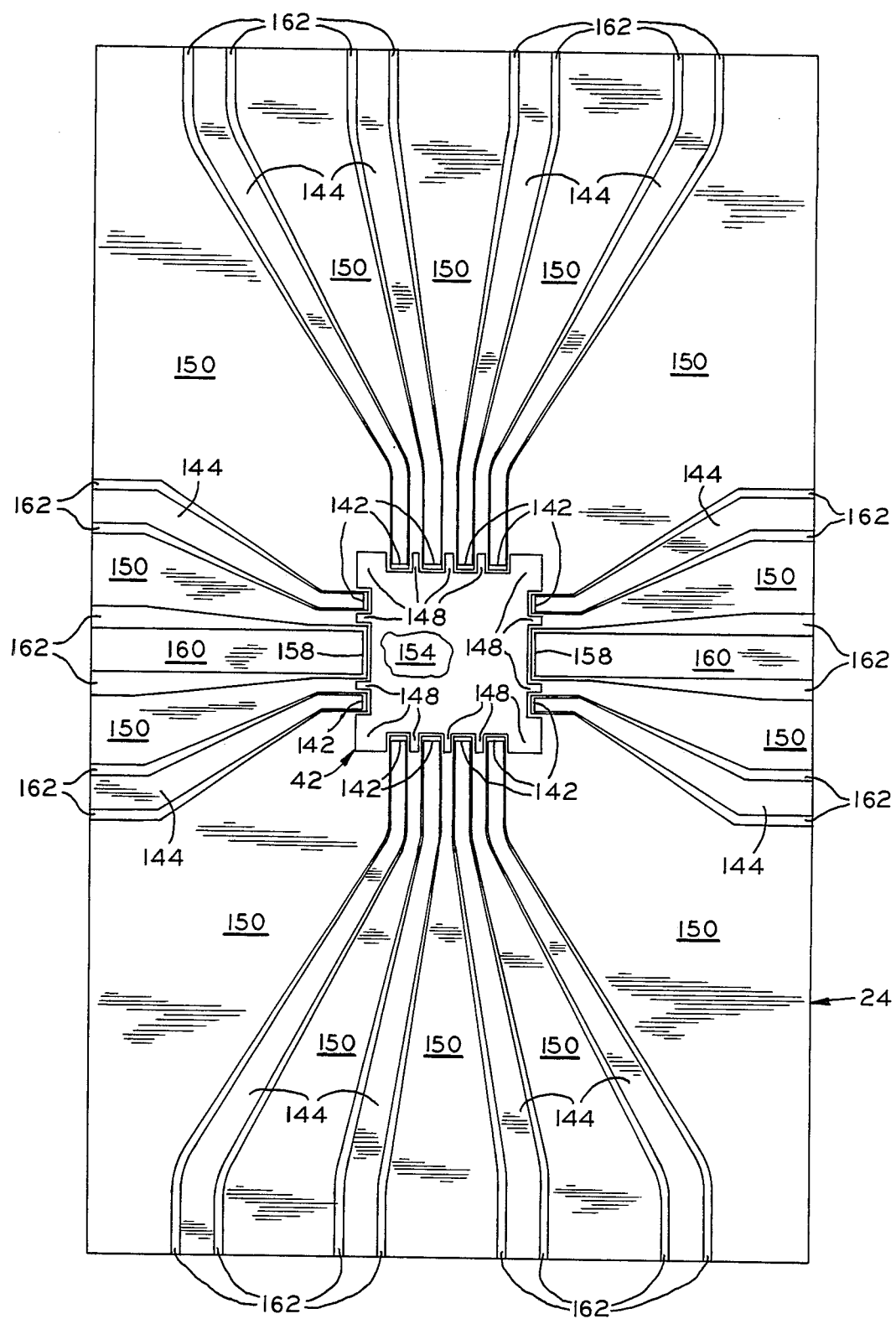
FIG. 14 is a top plan view partially broken away of the PC board with the carrier bottom layer mounted thereon.

Typically, the two power lines 160 in FIG. 14 carry power of opposite polarity and the power paths for power of one polarity through carrier 20 to corresponding portions 58 in FIG. 4 are separate from the power paths of the opposite polarity to corresponding portions 58 in FIG. 4.

While there have been described above the principles of this invention in connection with specific embodiments, it is to be understood that this is by way of example and is not limiting of the scope of this invention.

What is claimed is:

1. Carrier apparatus for an integrated circuit chip having power and signal terminals, the carrier apparatus adapted to be mounted on a printed circuit board comprising:

a printed circuit board having conductive signal lines and power lines;

a plurality of superimposed layers including a top layer and a bottom layer; a signal line layer and a power conductor layer being between said top and bottom layers and separated from each other and said top and bottom layers by a respective separating layer; at least one separating layer positioned on either side of said signal line layer and on either side of said power conductor layer;

said top layer having a mounting location for the chip; first and second conductive portions in said top layer adjacent the periphery of said mounting location;

conductive via pads in each of said separating layers conductively coupling predetermined conductive portions of one adjacent layer to predetermined conductive portions of another adjacent layer, each of said pads being surrounded by dielectric portions of its respective separating layer;

first conductive portions in said bottom layer coupling to the printed circuit board signal lines;

second conductive portions in said bottom layer coupling to the printed circuit board power lines;

said signal line layer having coplanar conductive signal lines each having first and second ends; said signal lines being separated by coplanar dielectric portions;

said via pads comprising first via pads in respective separating layers coupling said bottom layer first conductive portions to respective first ends of respective signal lines in said signal line layer;

said via pads comprising second via pads in the separating layer between said top layer and said signal line layer coupling said second ends of said signal lines to respective said first conductive portions in said top layer adjacent said mounting location;

said power conductor layer having coplanar conductive power conductors separated by coplanar dielectric portions;

said via pads comprising third via pads in the separating layer between said power conductor layer and said bottom layer coupling said bottom layer second conductive portions to respective conductors of said power conductors of said power conductor layer;

said via pads comprising fourth via pads in respective separating layers coupling said power conductors to respective said second conductive portions of said top layer adjacent said mounting location;

said separating layer having dielectric portions electrically insulating said signal lines and power conductors from each other and electrically insulating said signal lines and power conductors from said top and bottom layers.

2. The apparatus of claim 1 wherein said top layer is comprised of a grounded conductive portion coplanar with and substantially larger in area than said top layer first and second conductive portions; said top layer having coplanar dielectric portions electrically insulating said first and second conductive portions and said grounded conductive portion from each other; said bottom layer is comprised of a grounded conductive portion coplanar with and substantially larger in area than said bottom layer first and second conductive portions; said bottom layer having coplanar dielectric portions electrically insulating said first and second conductive portions and said bottom layer grounded conductive portion from each other.

3. The apparatus of claim 2 including a conductive cover having a top and sides depending therefrom; said sides having bottom edges; means bonding the bottom edges of said sides to said grounded conductive portion of the top surface of said top layer; said edges enclosing an area of said top surface including said mounting location and the area above said second and fourth via pads.

4. The apparatus of claim 2 including a bypass capacitor mounted to said top layer and conductively coupled between said fourth via pads and said grounded conductive portion of said top layer.

5. The apparatus of claim 1 wherein said via pads comprise sixth via pads coupling said top layer at said mounting location to a conductive portion of said bottom layer through conductive portions in said signal line layer and said power conductor layer and intermediate separating layers; said sixth via pads being beneath said mounting location, each of said conductive portions being surrounded by dielectric portions in its respective layer.

6. The apparatus of claim 5 including an integrated circuit chip having signal terminals and power terminals; said chip being mounted on said top layer mounting location; a first conductor connecting each said top layer first conductive portion to a respective chip signal terminal; a second conductor connecting each said top layer second conductive portion to a respective chip power terminal.

7. The apparatus of claim 1 wherein said signal line layer has grounded conductive portions; said power conductor layer has grounded conductive portions; said via pads comprise seventh via pads in said separating layers between said signal line layer grounded conductive portions and said power conductor layer grounded conductive portions; said seventh via pads being spaced from one another in the plane of their respective separating layers to break up cavities so that cavity resonant frequencies are substantially increased beyond signal frequencies and provide isolation between said signal lines.

8. The apparatus of claim 1 wherein said bottom layer first conductive portions comprise a conductive signal launcher pad overlying and in conductive contact with the printed circuit board signal lines providing substantially constant impedance from the printed circuit board signal lines to said top layer.

9. The apparatus of claim 8 including at least a pair of ground lines on the printed circuit board and coplanar with each said printed circuit board signal line; a ground line of said pair of ground lines being on either side of and insulated from each printed circuit board signal line; a spacing B being between said pair of printed circuit board ground lines; each printed circuit board signal line having a width W; the relative dimensions of B and W being determined to provide a predetermined printed circuit board signal line impedance; said bottom layer comprising a grounded conductive area having a plurality of substantially straight sides;
at least one of said bottom layer conductive area sides having at least one recessed notched opening having spaced side edges and an end edge; said opening side edges being spaced apart by a dimension D that is greater than dimension B; said signal launcher pad being elongated and having a lateral dimension C that is less than W; said elongated launcher pad extending into said notched opening and spaced from said opening side edges and end edge and said launcher pad having one end adjacent to said end edge of said opening and said launcher pad one end having a truncated triangular shape; the distance between said truncated triangular end and said end edge of said notched opening being greater than E/2 where E is the smaller of the quantity (W-C) and the quantity (D-B).

10. The apparatus of claim 9 including a said notched opening and a said signal launcher pad in said bottom layer for each printed circuit board signal line.

11. The apparatus of claim 1 wherein said via pads in each said separating layer are progressively larger in size than the size of said via pads in the next said separating layer nearer said top layer.

12. The apparatus of claim 2 wherein said plurality of layers includes an internal ground plane layer positioned between said signal line layer and said power conductor layer;
said ground plane layer having a grounded conductive portion;
said plurality of layers comprising a separating layer between said ground plane layer and said signal line layer and having dielectric portions electrically insulating said ground plane layer grounded conductive portion from said signal lines;
said plurality of layers comprising a separating layer between said ground plane layer and said power conductor layer and having dielectric portions electrically insulating said ground plane layer grounded conductive portion from said power conductors;
said via pads comprising fifth via pads in respective separating layers conductively coupling said grounded conductive portion of said ground plane layer to said grounded conductive portion in at least one of said top layer and said bottom layer through respective conductive portions in layers intermediate said ground plane layer and said at least one of said top layer and said bottom layer.

13. The apparatus of claim 12 wherein said fifth via pads couple said grounded conductive portion of said ground plane layer to said grounded conductive portions of both said top and bottom layers.

14. The apparatus of claim 13 wherein said via pads comprise sixth via pads in respective separating layers for coupling a conductive portion of said top layer at said mounting location to conductive portions in said signal line layer, ground plane layer, power conductor layer and bottom layer for thermal conductivity between said top layer mounting location conductive portion and said bottom layer grounded conductive portion.

15. The apparatus of claim 12 wherein said signal line layer has grounded conductive portions; said power conductor layer has grounded conductive portions; said fifth via pads including via pads in said separating layer between said signal line layer and said ground plane layer connecting said signal line layer grounded conductive portions and said ground plane layer grounded conductive portion; said fifth via pads including via pads in said separating layer between said power conductor layer and said ground plane layer connecting said power conductor layer grounded conductive portions and said ground plane layer grounded conductive portion and said fifth via pads being spaced from one another in the plane of their respective separating layers to break up cavities so that cavity resonant frequencies are substantially increased beyond signal frequencies and provide isolation between said signal lines.

16. The apparatus of claim 1 including a mounting location conductive portion in said top layer substantially coextensive with said mounting location; said conductive via pads including electrically and thermally conductive thermal via pads in each of said separating layers, and thermally conductive portions in each of said signal line layer, power conductor layer and bottom layer being vertically beneath said mounting location conductive portion; said mounting location conductive portion, thermal via pads and thermally conductive portions being conductively bonded to one another to form a thermally conductive path between said mounting location conductive portion and said bottom layer thermally conductive portion whereby an integrated circuit chip mounted on said top layer at said mounting location will have heat transfer to said bottom layer.

17. The apparatus of claim 12 including a mounting location conductive portion in said top layer substantially coextensive with said mounting location; said conductive via pads including electrically and thermally conductive thermal via pads in each of said separating layers, and thermally conductive portions in each of said signal line layer, ground plane layer, power conductor layer and bottom layer being vertically beneath said mounting location conductive portion; said mounting location conductive portion, thermal via pads and thermally conductive portions being conductively bonded to one another to form a thermally conductive path between said mounting location conductive portion and said bottom layer thermally conductive portion whereby an integrated circuit chip mounted on said top layer at said mounting location will have heat transfer to said bottom layer.

18. The apparatus of claim 16 or 17 including an integrated circuit chip having signal and power terminals and being conductively bonded to said mounting location conductive portion;
   coupling means to conductively couple said chip signal and power terminals to said first and second conductive portions, respectively in said top layer.

19. The apparatus of claim 18 wherein said mounting location conductive portion is recessed into said separating layer immediately below said top layer so that the top surface of said chip is approximately coplanar with the top surface of said top layer whereby the length of said coupling means is shortened.

20. The apparatus of claim 18 wherein said apparatus has an opening therein; said chip being placed in said opening whereby the top surface of said chip is approximately coplanar with the top surface of said top layer.

21. Apparatus for use with a printed circuit board comprising:
   a layer of dielectric material;
   a printed circuit board having at least one conductive signal line; at least a pair of ground lines on the printed circuit board coplanar with said printed circuit board signal line; a ground line of said pair of ground lines being on either side of and insulated from said printed circuit board signal line and having a spacing B between said pair of printed circuit board ground lines; the printed circuit board signal line having a width W; the relative dimensions of B and W being determined to provide a predetermined printed circuit board signal line impedance;
   a grounded conductive area being deposited on said dielectric layer; said grounded conductive area having a plurality of substantially straight sides; at least one of said grounded conductive area sides having at least one recessed notched opening having spaced side edges and an end edge; said opening side edges being spaced apart by a dimension D that is greater than dimension B;
   a conductive signal launcher pad overlying and in conductive contact with said printed circuit board signal line; said signal launcher pad being elongated and having a lateral dimension C that is less than W; said launcher pad extending into said notched opening and spaced from said opening side edges and said end edge; said launcher pad having one end adjacent to said end edge of said opening; said launcher pad one end having a truncated triangular shape; the distance between said truncated triangular end and said end edge of said notched opening being greater than E/2 where E is the smaller of the quantity (W-C) and the quantity (D-B) whereby a substantially constant impedance is provided from said printed circuit board signal line to said conductive area.

22. The apparatus of claim 21 including a plurality of said signal lines on said printed circuit board; a said notched opening in said conductive area and a signal launcher pad for each said printed circuit board signal line.

* * * * *